(12) United States Patent
Butler et al.

(10) Patent No.: US 9,634,241 B2
(45) Date of Patent: Apr. 25, 2017

(54) METHOD AND SYSTEM FOR PROVIDING MAGNETIC JUNCTIONS INCLUDING HEUSLER MULTILAYERS

(71) Applicant: Samsung Electronics Co., LTD., Gyeonggi-do (KR)

(72) Inventors: William H. Butler, Tuscaloosa, AL (US); Kamaram Munira, Tuscaloosa, AL (US); Roman Chepulskyy, Milpitas, CA (US); Dmytro Apalkov, San Jose, CA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 23 days.

(21) Appl. No.: 14/809,113

(22) Filed: Jul. 24, 2015

(65) Prior Publication Data

US 2016/0043301 A1 Feb. 11, 2016

Related U.S. Application Data

(60) Provisional application No. 62/033,939, filed on Aug. 6, 2014.

(51) Int. Cl.
*H01L 43/08* (2006.01)
*H01L 43/10* (2006.01)

(52) U.S. Cl.
CPC .............. *H01L 43/08* (2013.01); *H01L 43/10* (2013.01)

(58) Field of Classification Search
CPC ....... H01L 43/02; H01L 27/222; H01L 43/12; H01L 43/08
USPC ....................................................... 257/427
See application file for complete search history.

(56) References Cited

U.S. PATENT DOCUMENTS

| 8,760,818 B1 * | 6/2014 | Diao ................ G01R 33/093 360/313 |
| 2003/0197986 A1 | 10/2003 | Ambrose |
| 2004/0187980 A1 * | 9/2004 | Jung ................ C22C 1/0491 148/563 |
| 2008/0019060 A1 | 1/2008 | Mizuno |

(Continued)

OTHER PUBLICATIONS

Munira, et al, "Achieving perpendicular anisotropy in half-metallic Heusler alloys for spin device applications," Journal of Applied Physics, v115, n17, ISSN: 00218979, E-ISSN: 10897550; DOI: 10.1063/1.4866703, May 7, 2014.

(Continued)

*Primary Examiner* — Fernando L Toledo
*Assistant Examiner* — Adam S Bowen
(74) *Attorney, Agent, or Firm* — Convergent Law Group LLP

(57) ABSTRACT

A magnetic junction usable in a magnetic device and a method for providing the magnetic junction are described. The magnetic junction includes a free layer, a reference layer and nonmagnetic spacer layer between the free and reference layers. At least one of the free and reference layers includes at least one Heusler multilayer. Each of the at least one Heusler multilayer includes a plurality of Heusler adjoining layers that at least one interface. The Heusler layers include a plurality of Heusler alloys, have a plurality of lattice parameters and have a plurality of coefficients of thermal expansion. The magnetic junction is configured such that the free layer is switchable between stable magnetic states when a write current is passed through the magnetic junction.

20 Claims, 8 Drawing Sheets

(56) References Cited

U.S. PATENT DOCUMENTS

| | | |
|---|---|---|
| 2008/0052896 A1 | 3/2008 | Tsuchiya |
| 2009/0147562 A1 | 6/2009 | Clinton |
| 2009/0257151 A1 | 10/2009 | Zhang |
| 2010/0074092 A1 | 3/2010 | Zhu |
| 2013/0154034 A1* | 6/2013 | Apalkov ................. H01L 43/08 257/421 |
| 2013/0154036 A1* | 6/2013 | Tang ....................... H01L 43/08 257/421 |
| 2013/0236744 A1* | 9/2013 | Brinkman ............ G11B 5/3906 428/811.2 |
| 2014/0084401 A1 | 3/2014 | Kato |
| 2014/0175578 A1 | 6/2014 | Chan |

OTHER PUBLICATIONS

Wang, et al., "Structural and magnetic properties of Fe2CrSi Heusler Alloy and Tunneling magnetoresistance of its magnetic tunneling junctions," Nanoelectronics Conference (INEC), 2013 IEEE 5th International, DOI: 0.1109/INEC.2013.6466002, pp. 215-218, 2013.

* cited by examiner

METHOD AND SYSTEM FOR PROVIDING MAGNETIC JUNCTIONS INCLUDING HEUSLER MULTILAYERS

CROSS-REFERENCE TO RELATED APPLICATIONS

This application claims the benefit of provisional Patent Application Ser. No. 62/033,939, filed Aug. 6, 2014, entitled HEUSLER MULTILAYERS FOR HIGH PMA STT-MRAM, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-MRAM. The conventional MTJ 10 typically resides on a substrate 12. A bottom contact 14 and top contact 22may be used to drive current through the conventional MTJ 10. The conventional MTJ, uses conventional seed layer(s) (not shown), may include capping layers (not shown) and may include a conventional antiferromagnetic (AFM) layer (not shown). The conventional magnetic junction 10 includes a conventional reference layer 16, a conventional tunneling barrier layer 18, and a conventional free layer 20. Also shown is top contact 22. Conventional contacts 14 and 22 are used in driving the current in a current-perpendicular-to-plane (CPP) direction, or along the z-axis as shown in FIG. 1. Typically, the conventional reference layer 16 is closest to the substrate 12 of the layers 16, 18 and 20.

The conventional reference layer 16 and the conventional free layer 20 are magnetic. The magnetization 17 of the conventional reference layer 16 is fixed, or pinned, in a particular direction. Although depicted as a simple (single) layer, the conventional reference layer 16 may include multiple layers. For example, the conventional reference layer 16 may be a synthetic antiferromagnetic (SAF) layer including magnetic layers antiferromagnetically coupled through thin conductive layers, such as Ru. In such a SAF, multiple magnetic layers interleaved with a thin layer of Ru may be used. In another embodiment, the coupling across the Ru layers can be ferromagnetic.

The conventional free layer 20 has a changeable magnetization 21. Although depicted as a simple layer, the conventional free layer 20 may also include multiple layers. For example, the conventional free layer 20 may be a synthetic layer including magnetic layers antiferromagnetically or ferromagnetically coupled through thin conductive layers, such as Ru. Although shown as perpendicular-to-plane, the magnetization 21 of the conventional free layer 20 may be in plane. Thus, the reference layer 16 and free layer 20 may have their magnetizations 17 and 21, respectively oriented perpendicular to the plane of the layers.

Because of their potential for use in a variety of applications, research in magnetic memories is ongoing to improve the performance of the STT-RAM. For example, in order to achieve perpendicular magnetic moments 17 and 21, various structures have been proposed. However, such structures may suffer from higher damping (which increases the required switching current), a lower magnetoresistance that decreases the signal and/or other issues. Accordingly, what is needed is a method and system that may improve the performance of the spin transfer torque based memories. The method and system described herein address such a need.

BRIEF SUMMARY OF THE INVENTION

A magnetic junction usable in a magnetic device and a method for providing the magnetic junction are described. The magnetic junction includes a free layer, a reference layer and nonmagnetic spacer layer between the free and reference layers. At least one of the free and reference layers includes at least one Heusler multilayer. Each of the at least one Heusler multilayer includes a plurality of Heusler adjoining layers that at least one interface. The Heusler layers include a plurality of Heusler alloys, have a plurality of lattice parameters and have a plurality of coefficients of thermal expansion. The magnetic junction is configured such that the free layer is switchable between stable magnetic states when a write current is passed through the magnetic junction.

DETAILED DESCRIPTION OF THE INVENTION

Figure 1:
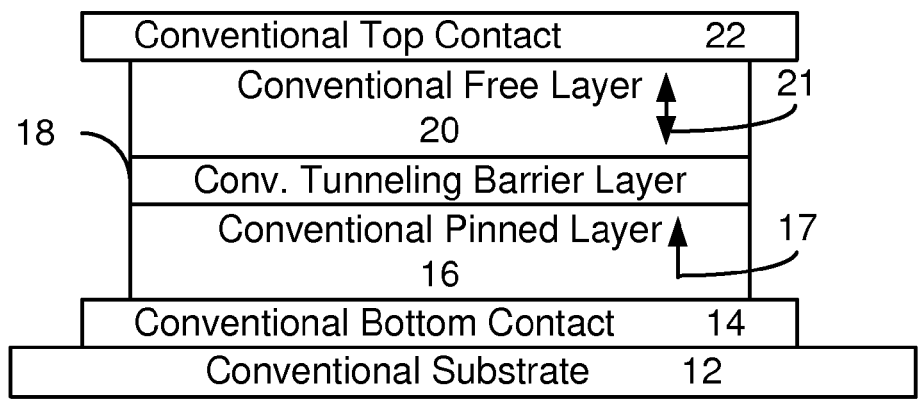
FIG. 1 depicts a conventional magnetic junction.

The exemplary embodiments relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tables, laptops and other portable and non-portable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction.

A magnetic junction usable in a magnetic device and a method for providing the magnetic junction are described. The magnetic junction includes a free layer, a reference layer and nonmagnetic spacer layer between the free and reference layers. At least one of the free and reference layers includes at least one Heusler multilayer. Each of the at least one Heusler multilayer includes a plurality of Heusler adjoining layers that at least one interface. The Heusler layers include a plurality of Heusler alloys, have a plurality of lattice parameters and have a plurality of coefficients of thermal expansion. The magnetic junction is configured such that the free layer is switchable between stable magnetic states when a write current is passed through the magnetic junction.

Figure 2:
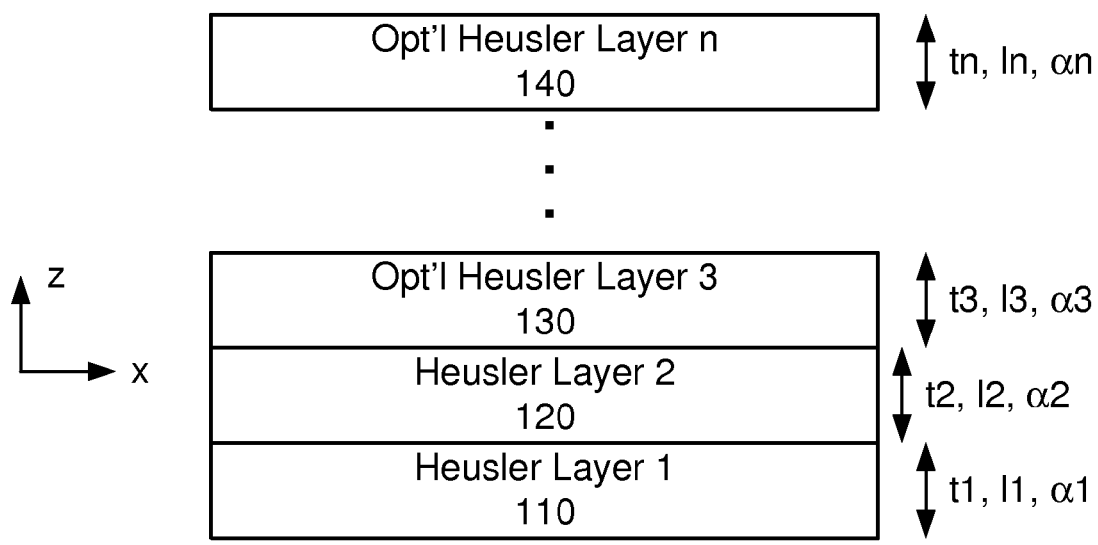
FIG. 2 depicts an exemplary embodiment of a Heusler multilayer.

FIG. 2 depicts an exemplary embodiment of a Heusler multilayer 100. For clarity, FIG. 2 is not to scale and seed layer(s) on which the Heusler multilayer 100 may be grown are not depicted. The Heusler multilayer 100 is usable in a magnetic layer of a magnetic junction. For example, the Heusler multilayer 100 may be used in a free layer and/or a reference layer of a magnetic junction. Thus, the Heusler multilayer 100 may be used in the free layer only, the reference layer(s) only, or in the free and reference layers. In some embodiments, multiple Heusler multilayers 100 may be used in a single free layer and/or a single reference layer.

The Heusler multilayer 100 includes multiple adjoining Heusler layers 110, 120, 130 through 140. In the embodiment shown, the Heusler multilayer 100 includes n individual Heusler layers. In other embodiments, another number of Heusler layers may be present. In some embodiments, as few as two Heusler layers 110 and 120 are present. The Heusler layers 110, 120, 130 through 140 share interfaces. Thus, the Heusler layer 110 and 120 share an interface, the Heusler layers 120 and 130 also share an interface and the Heusler layers 140 and n−1 (not shown) share an interface. Some or all of the Heusler layers 110, 120, 130 through 140 may have a perpendicular magnetic anisotropy (PMA) energy that exceeds the out-of-plane demagnetization energy. Thus, the magnetic moment of the layer(s) 110, 120, 130 and/or through 140 may be perpendicular to plane (along the z-direction). In other embodiments, some or all of the Heusler layers 110, 120, 130 through 140 may have a PMA energy that does not exceed the out-of-plane demagnetization energy.

In addition to sharing an interface, adjoining Heusler layers 110, 120, 130 and/or 140 are made of different Heusler alloys. For example, Heusler layer 110 is formed of a different Heusler alloy than Heusler layer 120. Heusler layer 120 is formed of a different Heusler alloy than Heusler layer 130. However, Heusler layers 110 and 130 may be the same or different Heusler alloys. Thus, there may be some repetition of material(s) within the Heusler multilayer 100. The Heusler alloys used for the Heusler layers 110, 120, 130 through 140 may have an $L2_1$ structure. For example, the Heusler alloys used may be a $X_2YZ$ Heusler alloy. In such an embodiment, where X may be selected from Cr, Mn, Fe, Co, Ni, Cu, Zn, Ru, Rh, Pd, Ag, Cd, Ir, Pt, Au, Gd, Tb, Dy, Ho, Er, Tm, Yb and Lu; Y may be selected from Ti, V, Cr, Mn, Fe, Y, Zr, Nb, HF, Ta; and Z may be selected from Al, Si, Ga, Ge, As, In, Sn, Sb, Pb and Bi. For example, the Heusler multilayer 100 may include a trilayer of $Co_2VGa$, $Co_2VAl$ and $Fe_2TiGa$, a bilayer of $Co_2MnSi$ and $Co_2MnAl$, and/or a trilayer of $Fe_2MnAs$, $Co_2MnGe$ and $Co_2MnSb$. Such materials may be of particular use near an MgO barrier layer. These materials may also be used in other combinations. Other materials that might be used in the Heusler multilayer 100 include but are not limited to bilayers including $Co_2MnSn$, $Fe_2MnSi$, $Co_2FeSb$, $Co_2MnSb$, $Co_2CrSb$, $Co_2CrBi$, $Co_2CrSn$, $Co_2MnBi$, $Co_2CrSi$, $Co_2CrPb$, $Co_2VGa$, $Co_2VAl$ and/or $Co_2VSn$. Similarly, the Heusler multilayer might include bilayers of $Co_2MnSi$ and $Co_2MnSn$, $Co_2MnSi$ and $Fe_2MnSi$, $Co_2MnSn$ and $Co_2FeSb$, $Co_2MnSn$ and $Co_2MnSb$, $Co_2MnSb$ and $Co_2CrSb$, $Co_2MnSb$ and $Co_2CrBi$, $Co_2CrSn$ and $Co_2MnBi$, $Co_2CrSi$ and $Co_2MnBi$, $Co_2CrPb$ and $Co_2MnBi$, $Co_2VGa$ and $Co_2VAl$, and/or $Co_2VGa$ and $Co_2VSn$. Other possibilities for and/or other combinations of X, Y and Z exist. In addition, different combinations of Heusler alloys for adjacent layers may be used. In general, the Heusler alloys used in the Heusler multilayer 100 have a high spin polarization, low damping, may be used within a magnetic junction including crystalline MgO barrier layer(s) to achieve a high tunneling magnetoresistance (TMR), have a higher spin polarization and have a high PMA (i.e. a PMA energy that exceeds the out-of-plane demagnetization energy). For example, the Heusler alloy may have a high spin polarization of at least 0.5. In some embodiments, the spin polarization is at least 0.8 and not more than 1.0. The Heusler alloy may have a low damping coefficient of less than 0.005. In some embodiments, the damping is less than 0.001. However, one or more of these properties may be omitted from the Heusler alloys used.

Because different Heusler alloys are used for at least some of the layers 110, 120, 130 through 140, the lattice parameters, I, and the coefficients of thermal expansion, α, may differ for the Heusler layers 110, 120, 130 through 140. For example, the Heusler layer 110 is formed of a Heusler alloy having a lattice parameter I1 and a coefficient of thermal expansion α1. The Heusler layer 120 is formed of a Heusler alloy having a lattice parameter I2 and a coefficient of thermal expansion α2. The Heusler layers 130 and 140 are formed of Heusler alloy(s) having lattice parameter(s) I3 and In and coefficients of thermal expansion α3 and αn, respectively. Because adjoining Heusler layers 110, 120, 130 through 140 are formed from different Heusler alloys, the lattice parameters and coefficients of thermal expansion of adjoining layers also generally differ. For example, the lattice parameter and coefficient of thermal expansion for the Heusler layer 110 differ from those of the Heusler layer 120 (I1≠I2, α1≠α2). Similarly, the lattice parameters and coefficients of thermal expansion for the Heusler layers 120 and 130 generally differ (I2≠I3, α2≠α3) because these layers are formed of different Heusler alloys. Thus, there is a lattice mismatch between adjoining Heusler layers of the Heusler multilayer 100. In general, the lattice mismatch is desired to be less than ten percent. In some embodiments, the lattice mismatch may be not more than five percent. However, there is no requirement that all of the coefficients of thermal expansion and all of the lattice parameters differ. For example, it is possible that the layers 110 and 130 are formed of the same Heusler alloy (I1=I3, α1=α3). Alternatively, it is possible that the layers 110 and 130 are formed of different Heusler alloys having different lattice parameters and different coefficients of thermal expansion (I1≠I2, I2≠I3, I1≠I3, α1≠α2, α2≠α3, α1≠α3).

Because different Heusler alloys are used for at least some of the layers 110, 120, 130 through 140, the lattice parameters, I, may differ for the Heusler layers 110, 120, 130 through 140. For example, the Heusler layer 110 is formed of a Heusler alloy having a lattice parameter I1 1. The Heusler layer 120 is formed of a Heusler alloy having a lattice parameter I2 2. The Heusler layers 130 and 140 are formed of Heusler alloy(s) having lattice parameter(s) I3 and In, respectively. Because adjoining Heusler layers 110, 120, 130 through 140 are formed from different Heusler alloys, the lattice parameters also generally differ. For example, the lattice parameter for the Heusler layer 110 differs from that of the Heusler layer 120 (I1≠I2). Similarly, the lattice parameters for the Heusler layers 120 and 130 generally differ (I2≠I3) because these layers are formed of different Heusler alloys. Thus, there is a lattice mismatch between adjoining Heusler layers of the Heusler multilayer 100. In general, the lattice mismatch is desired to be less than ten percent. In some embodiments, the lattice mismatch may be not more than five percent. However, there is no requirement that all of the lattice parameters differ. For example, it is possible that the layers 110 and 130 are formed of the same Heusler alloy (I1=I3). Alternatively, it is possible that the layers 110 and 130 are formed of different Heusler alloys having different lattice parameters (I1≠I2, I2≠I3, I1≠I3).

Similarly, the coefficients of thermal expansion, α, may differ for the Heusler layers 110, 120, 130 through 140 because different Heusler alloys are used for at least some of the layers 110, 120, 130 through 140. For example, the Heusler layer 110 is formed of a Heusler alloy having a coefficient of thermal expansion α1. The Heusler layer 120 is formed of a Heusler alloy having a coefficient of thermal expansion α2. The Heusler layers 130 and 140 are formed of Heusler alloy(s) having coefficients of thermal expansion α3 and αn, respectively. Because adjoining Heusler layers 110, 120, 130 through 140 are formed from different Heusler alloys, the coefficients of thermal expansion of adjoining layers also generally differ. For example, the coefficient of thermal expansion for the Heusler layer 110 differs from that of the Heusler layer 120 (α1≠α2). Similarly, the coefficients of thermal expansion for the Heusler layers 120 and 130 generally differ (α2≠α3) because these layers are formed of different Heusler alloys. However, there is no requirement that all of the coefficients of thermal expansion differ. For example, it is possible that the layers 110 and 130 are formed of the same Heusler alloy (I1=I3, α1=α3). Alternatively, it is possible that the layers 110 and 130 are formed of different Heusler alloys having different lattice parameters and different coefficients of thermal expansion (I1≠I2, I2≠I3, I1≠I3, α1≠α2, α2≠α3, α1≠α3).

The Heusler layers 110, 120, 130 through 140 are also characterized by a layer thickness t1, t2, t3 and tn, respectively. In the embodiment shown, the Heusler layers 110, 120, 130 and 140 all appear to have substantially the same thickness. However, the thicknesses of the Heusler layers 110, 120, 130 and 140 may differ. Thus, the layers of the Heusler multilayer 100 may have a gradient in the thickness. For example, the thicknesses of the layers 110 through 140 may decrease in some embodiments. Thus, the layer 130 is thinner than the layer 120, which is thinner than the layer 110. In other embodiments, the thicknesses of the layers 110 through 140 may increase. The thicknesses of the layers 110, 120, 130 through 140 as well as the Heusler alloys used (and thus lattice parameters and coefficients of thermal expansion) of the Heusler layers 110, 120, 130 through 140 may be tailored such that the Heusler multilayer has the desired properties. In general, each of the layers 110, 120, 130 through 140 is desired to have a thickness that is less than 1.5 Angstroms and does not exceed ten Angstroms. Other thicknesses may, however, be possible.

The Heusler multilayer 100 may allow the magnetic junction in which it is used to have improved performance. Because the lattice parameter, coefficient of thermal expansion, thickness and Heusler alloys used in the layers 110, 120, 130 through 140 can be tailored, the magnetic properties of the Heusler multilayer 100 may be configured. For example, the PMA may be interfacial in nature and due at least in part to stresses at the interfaces between the layers 110, 120, 130, through 140. Such stresses may be induced by lattice parameter mismatches at the interfaces. This PMA may be further enhanced by thinner layers having a higher interface to volume ratio. The PMA may also be tailored throughout the Heusler multilayer 100. The thicknesses of the layers 110, 120, 130 through 140 may change. Regions of the Heusler multilayer 100 having thinner Heusler layers may have a higher PMA than regions of the Heusler multilayer 100 having thicker Heusler layers. For example, if the thickness of the Heusler layers 110, 120, 130 through 140 increases from bottom to top, then the Heusler multilayer 100 may have a higher PMA near the layer 110 than near the layer 140. The Heusler alloys may also be selected so that the coefficients of thermal expansion allow for lattice expansion or contraction in the desired manner. For example, the lattice parameters of adjoining layers may become closer or further apart upon heating. The stress-induced portion of the PMA may thus be configured to decrease or increase with increasing temperature. The properties of the Heusler multilayer 100, and thus the magnetic junction in which the multilayer 100 is used, may be controlled.

Figure 3:
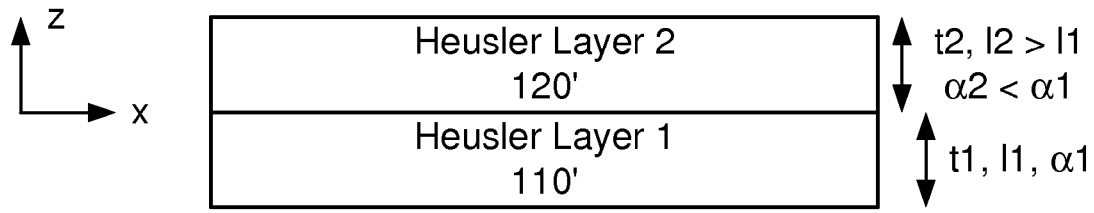
FIG. 3 depicts another exemplary embodiment of a Heusler multilayer.

FIG. 3 depicts an exemplary embodiment of a Heusler multilayer 100'. For clarity, FIG. 3 is not to scale and seed layer(s) on which the Heusler multilayer 100' may be grown are not depicted. The Heusler multilayer 100' is usable in a magnetic layer of a magnetic junction. For example, the Heusler multilayer 100' may be used in a free layer and/or a reference layer of a magnetic junction. In some embodiments, multiple Heusler multilayers 100' may be used in a free layer and/or a reference layer.

The Heusler multilayer 100' is analogous to the Heusler multilayer 100. Similar components thus have analogous labels. The Heusler multilayer 100' includes a first Heusler layer 110' and a second Heusler layer 120' that adjoins and shares an interface with the first Heusler layer 110'. One or both of the Heusler layers 110' and 120' may have a PMA energy that exceeds the out-of-plane demagnetization energy. Thus, the magnetic moment of the layer(s) 110' and/or 120' may be perpendicular to plane (along the z-direction). This PMA may be due at least in part to the presence of the interface between the layers 110' and 120' and any lattice mismatch between the Heusler layers 110' and 120'. The Heusler alloys used in the Heusler layers 110' and 120' may thus have the structure described above and include the alloys described herein. However, other Heusler alloys may also be used. In addition, in other embodiments, the PMA energy may not exceed the out-of-plane demagnetization energy. Note that although a bilayer is shown, more than two layers may be provided in the multilayer 100'. In one such embodiment, the multilayer 100' may include multiple bilayers made up of the layers 110' and 120' repeated m times. In addition, the Heusler layer 110' is shown below (e.g. closer to a substrate) than the Heusler layer 120'. In other embodiments, their order might be reversed such that the Heusler layer 120' is below (closer to the substrate) than the Heusler layer 110'.

The Heusler layers 110' and 120' are also configured such that the lattice parameter for the layer 110' is smaller than that of the layer 120', but the coefficient of thermal expansion of the layer 110' exceeds that of the layer 120'. Stated differently, I2>I1 and α2<α1. Because the Heusler multilayer 100' is configured with I2>I1 and α2<α1, the lattice parameters of the layers 110' and 120' grow closer with increasing temperature. In general, when used in a magnetic junction, the temperature of the Heusler multilayer 100' increases during operation of the magnetic junction. For example, if a write or read current is driven through the magnetic junction, and thus through the Heusler multilayer 100', the temperature of the Heusler multilayer 100' increases. Because the Heusler multilayer 100' has I2>I1 and α2<α1, the lattice parameters may become closer together during operation of the device. Stated differently, the lattice mismatch between the layers 110' and 120' may be reduced at higher temperatures. Because the PMA of the Heusler multilayer 100' may be due at least in part to stresses induced by the lattice mismatch, the PMA of the Heusler multilayer 100' may decrease with increasing temperature.

The Heusler multilayer 100' may share the benefits of the Heusler multilayer 100. Thus, the Heusler multilayer 100' may allow the magnetic junction in which it is used to have improved performance. Because the lattice parameter, coefficient of thermal expansion, thickness and Heusler alloys used in the layers 110' and 120' can be tailored, the magnetic properties of the Heusler multilayer 100' may be configured. Further, the lattice parameters of adjoining layers 110' and 120' may become closer during use/heating of the Heusler multilayer. The PMA for the Heusler multilayer 100', which may be due at least in part to the lattice mismatch, is thus reduced at higher temperatures. If used in the free layer of a magnetic junction, the Heusler multilayer 100' has reduced PMA at higher temperatures, such as during a write operation. Thus, a free layer using the Heusler multilayer 100' may be written using a lower write current. The Heusler multilayer 100' may be more readily switched. Thus, performance of the magnetic junction including the Heusler multilayer 100' may have improved performance.

Figure 4:
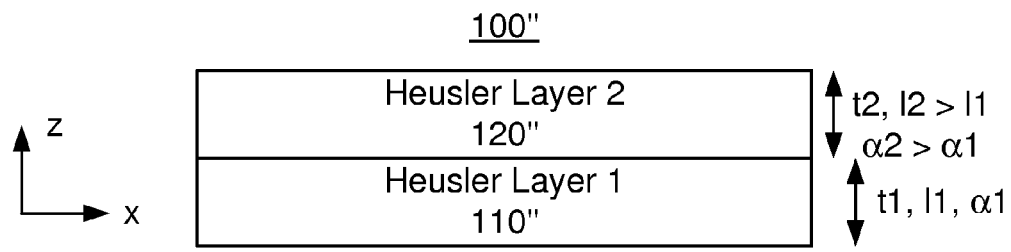
FIG. 4 depicts another exemplary embodiment of a Heusler multilayer.

FIG. 4 depicts an exemplary embodiment of a Heusler multilayer 100". For clarity, FIG. 4 is not to scale and seed layer(s) on which the Heusler multilayer 100" may be grown are not depicted. The Heusler multilayer 100" is usable in a magnetic layer of a magnetic junction. For example, the Heusler multilayer 100" may be used in a free layer and/or a reference layer of a magnetic junction. In some embodiments, multiple Heusler multilayers 100" may be used in a free layer and/or a reference layer.

The Heusler multilayer 100" is analogous to the Heusler multilayer(s) 100 and/or 100'. Similar components thus have analogous labels. The Heusler multilayer 100" includes a first Heusler layer 110" and a second Heusler layer 120" that adjoins and shares an interface with the first Heusler layer 110". One or both of the Heusler layers 110" and 120" may have a PMA energy that exceeds the out-of-plane demagnetization energy. This PMA may be due at least in part to the presence of the interface between the layers 110" and 120" and any lattice mismatch between the Heusler layers 110" and 120". The Heusler alloys used in the Heusler layers 110" and 120" may thus have the structure described above and include the alloys described herein. However, other Heusler alloys may also be used. In other embodiments, the PMA energy may not exceed the out-of-plane demagnetization energy. Note that although a bilayer is shown, more than two layers may be provided in the multilayer 100". In one such embodiment, the multilayer 100" may include multiple bilayers made up of the layers 110' and 120" repeated m times. In addition, the Heusler layer 110" is shown below (e.g. closer to a substrate) than the Heusler layer 120". In other embodiments, their order might be reversed such that the Heusler layer 120" is below (closer to the substrate) than the Heusler layer 110".

The Heusler layers 110" and 120" are also configured such that the lattice parameter for the layer 110" is smaller than that of the layer 120", and such that the coefficient of thermal expansion of the layer 110" is less than that of the layer 120". Stated differently, $I2>I1$ and $\alpha 2>\alpha 1$. Because the Heusler multilayer 100" is configured with $I2>I1$ and $\alpha 2>\alpha 1$, the lattice parameters of the layers 110" and 120" grow further apart with increasing temperature. In general, when used in a magnetic junction, the temperature of the Heusler multilayer 100" increases during operation of the magnetic junction. For example, the application of a write or read current through the Heusler multilayer 100" generally causes an increase in the temperature of the Heusler multilayer 100". Because the Heusler multilayer 100' has $I2>I1$ and $\alpha 2>\alpha 1$, the lattice mismatch between the layers 110" and 120" may increase at higher temperatures. Because the PMA of the Heusler multilayer 100' may be due at least in part to stresses induced by the lattice mismatch, the PMA of the Heusler multilayer 100' may increase with increasing temperature.

The Heusler multilayer 100" may share the benefits of the Heusler multilayer(s) 100 and/or 100'. Thus, the Heusler multilayer 100" may allow the magnetic junction in which it is used to have improved performance. Because the lattice parameter, coefficient of thermal expansion, thickness and Heusler alloys used in the layers 110" and 120" can be tailored, the magnetic properties of the Heusler multilayer 100" may be configured. Further, the lattice mismatch between adjoining layers 110" and 120" may increase during use/heating of the Heusler multilayer. The PMA for the Heusler multilayer 100" may thus increase at higher temperatures. As a result, the thermal stability constant, $\Delta$, may increase or remain constant at higher temperatures. This may be desirable in some applications of the magnetic junction and, therefore, Heusler multilayer 100". Thus, performance of the magnetic junction including the Heusler multilayer 100" may have improved performance.

Figure 5:
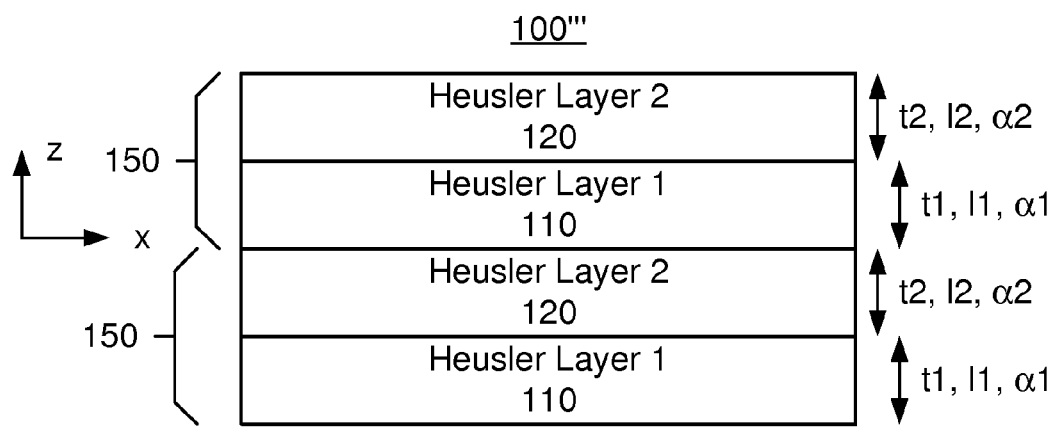
FIG. 5 depicts another exemplary embodiment of a Heusler multilayer.

FIG. 5 depicts an exemplary embodiment of a Heusler multilayer 100'''. For clarity, FIG. 5 is not to scale and seed layer(s) on which the Heusler multilayer 100''' may be grown are not depicted. Heusler multilayer 100''' is usable in a magnetic layer of a magnetic junction. For example, the Heusler multilayer 100''' may be used in a free layer and/or a reference layer of a magnetic junction. In some embodiments, multiple Heusler multilayers 100''' may be used in a free layer and/or a reference layer.

The Heusler multilayer 100''' is analogous to the Heusler multilayer(s) 100, 100' and/or 100". Similar components thus have analogous labels. The Heusler multilayer 100''' includes a first Heusler layer 110 and a second Heusler layer 120 that adjoins and shares an interface with the first Heusler layer 110. One or both of the Heusler layers 110 and 120 may have a PMA energy that exceeds the out-of-plane demagnetization energy. The Heusler alloys used in the Heusler layers 110 and 120 may thus have the structure described above and include the alloys described herein. However, other Heusler alloys may also be used. In other embodiments, the PMA energy may not exceed the out-of-plane demagnetization energy. The lattice parameters and coefficients of thermal expansion of the layers 110 and 120 also differ because different Heusler alloys are used in the layers 110 and 120.

The Heusler layers 110 and 120 form a bilayer 150. The Heusler multilayer 100''' is shown as having two repeats of the bilayer 150. In other embodiments, another number of repeats may be included. Thus, the Heusler multilayer 100''' may have as few as one bilayer 150.

The Heusler multilayer 100''' may share the benefits of the Heusler multilayer(s) 100, 100' and/or 100". Thus, the Heusler multilayer 100''' may allow the magnetic junction in which it is used to have improved performance.

Figure 6:
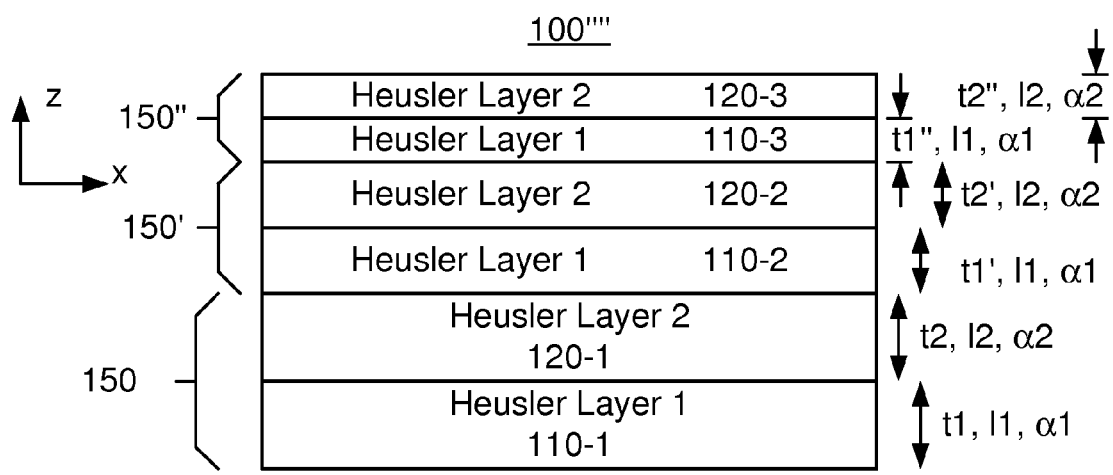
FIG. 6 depicts another exemplary embodiment of a Heusler multilayer.

FIG. 6 depicts an exemplary embodiment of a Heusler multilayer 100"". For clarity, FIG. 6 is not to scale and seed layer(s) on which the Heusler multilayer 100"" may be grown are not depicted. The Heusler multilayer 100"" is usable in a magnetic layer of a magnetic junction. For example, the Heusler multilayer 100"" may be used in a free layer and/or a reference layer of a magnetic junction. In some embodiments, multiple Heusler multilayers 100''' may be used in a free layer and/or a reference layer.

The Heusler multilayer 100"" is analogous to the Heusler multilayer(s) 100, 100', 100" and/or 100'''. Similar components thus have analogous labels. The Heusler multilayer 100"" includes multiple bilayers 150, 150' and 150" having different thicknesses. The Heusler alloys used in the bilayers 150, 150' and 150" may have a PMA energy that exceeds the out-of-plane demagnetization energy, have the structure described above and include the alloys described herein. However, other Heusler alloys may also be used. In other embodiments, the PMA energy may not exceed the out-of-plane demagnetization energy.

The Heusler multilayer includes a Heusler bilayer 150 formed of Heusler layer 110-1 and Heusler layer 120-1. The Heusler layer 110-1 has a thickness t1, a lattice parameter I1 and a coefficient of thermal expansion $\alpha 1$. The Heusler layer 120-1 has a thickness t2, a lattice parameter I2 and a coefficient of thermal expansion $\alpha 2$. Because the adjoining Heusler layers 110-1 and 120-1 are formed of different Heusler alloys, there is a lattice mismatch and generally a difference in coefficients of thermal expansion ($I1 \neq I2$, $\alpha 1 \neq \alpha 2$). The bilayer 150' is formed of the same Heusler alloys but with layers having different thicknesses. Thus, the Heusler bilayer 150' includes Heusler layer 110-2 and Heusler layer 120-2. The Heusler layer 110-2 has a thickness t1', the lattice parameter I1 and the coefficient of thermal expansion $\alpha 1$. The Heusler layer 120-2 has a thickness t2', the lattice parameter I2 and the coefficient of thermal expansion $\alpha 2$. Similarly, the bilayer 150" includes Heusler layer 110-3 and Heusler layer 120-3. The Heusler layer 110-2 has a thickness t1", the lattice parameter l1 and the coefficient of thermal expansion α1. The Heusler layer 120-3 has a thickness t2", the lattice parameter l2 and the coefficient of thermal expansion α2. Thus, each Heusler layer 110-1, 110-2 and 110-3 is formed of the same material and adjoins/shares an interface with Heusler layers 120-1, 120-2 an 120-3 of a different Heusler alloy. In the embodiment shown, the thicknesses of the layers decreases with increasing index. Thus, t1 for the Heusler layer 110-1 is greater than t1' for the Heusler layer 110-2. Similarly, t1' for the Heusler layer 110-2 is greater than t1" for the Heusler layer 110-3. Similarly, t2>t2'>t2".

The Heusler multilayer 100'" may share the benefits of the Heusler multilayer(s) 100, 100', 100" and/or 100"'. The Heusler multilayer 100"" also has a gradient in the thickness of the Heusler layers. In the embodiment shown, the thickness of the layers changes in the z-direction. However, other variations are possible. Because the bilayer 150" is thinner than the bilayer 150', interfacial effects for the bilayer 150" may be more important than for the bilayer 150'. Thus, the bilayer 150" may have increased PMA. For similarly reasons, the bilayer 150' may have a higher PMA than the bilayer 150. Thus, the Heusler multilayer 100"" may have a gradient in the PMA which results in the PMA increasing in the z-direction. Such a Heusler multilayer 100"" may have particular utility when used as or in a free layer or reference layer in which an MgO tunneling barrier layer is closest to the bilayer 150. Thus, the Heusler multilayer 100"" may allow the magnetic junction in which it is used to have improved performance.

Figure 7:
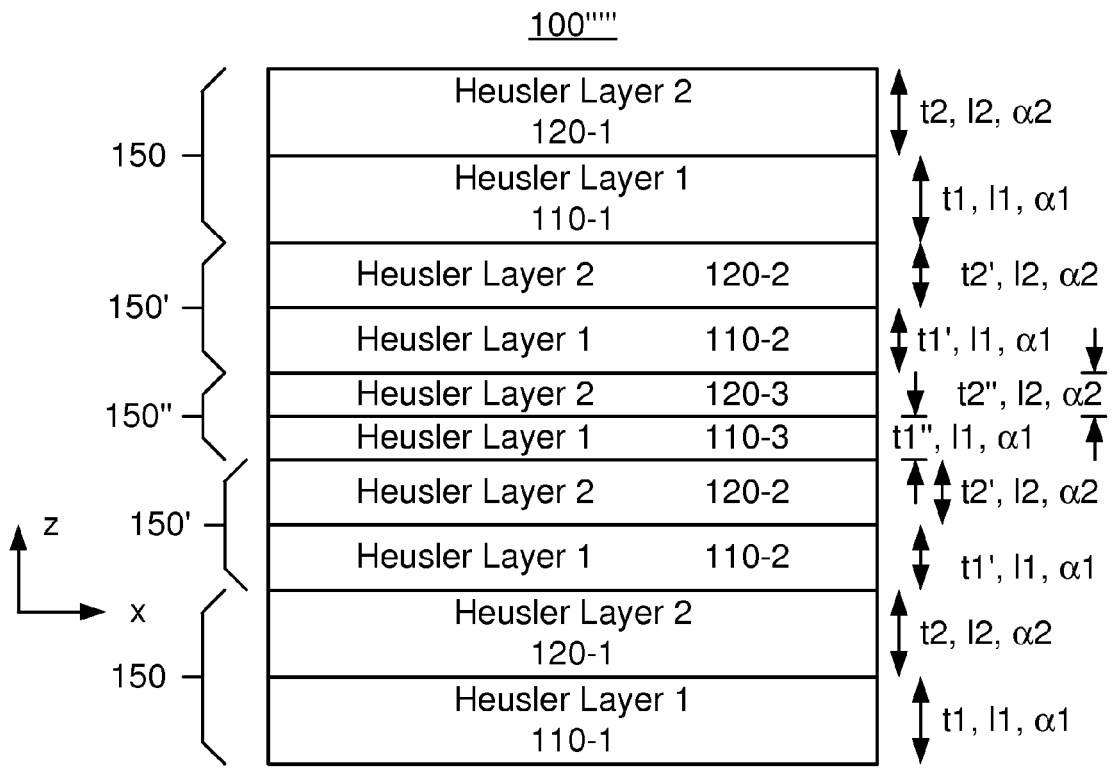
FIG. 7 depicts another exemplary embodiment of a Heusler multilayer.

FIG. 7 depicts an exemplary embodiment of a Heusler multilayer 100""'. For clarity, FIG. 7 is not to scale and seed layer(s) on which the Heusler multilayer 100""' may be grown are not depicted. The Heusler multilayer 100""' is usable in a magnetic layer of a magnetic junction. For example, the Heusler multilayer 100""' may be used in a free layer and/or a reference layer of a magnetic junction. In some embodiments, multiple Heusler multilayers 100""' may be used in a free layer and/or a reference layer.

The Heusler multilayer 100""' is analogous to the Heusler multilayer(s) 100, 100', 100", 100'" and/or 100"". Similar components thus have analogous labels. The Heusler multilayer 100""' includes multiple bilayers 150, 150' and 150" having different thicknesses. The Heusler alloys used in the bilayers 150, 150' and 150" may have a PMA energy that exceeds the out-of-plane demagnetization energy, have the structure described above and include the alloys described herein. However, other Heusler alloys may also be used. In other embodiments, the PMA energy may not exceed the out-of-plane demagnetization energy.

The Heusler multilayer 100""' includes two bilayers 150 and two bilayers 150'. Thus, the Heusler multilayer 100""' has a gradient in the thickness of the bilayers such that the thickness first decreases, then increases in the z-direction.

The Heusler multilayer 100""' may share the benefits of the Heusler multilayer(s) 100, 100', 100", 100'" and/or 100"". Because of the variation in thickness of the layers, the density of interfaces also varies in the Heusler multilayer 100""'. The Heusler multilayer 100""' may have a gradient in the PMA which results in the PMA increasing and then decreasing in the z-direction because of this variation in thickness. Such a Heusler multilayer 100""' may have particular utility when used as or in a free layer in a dual magnetic junction. Thus, the MgO tunneling barrier layers are closest to the bilayers 150. Thus, the Heusler multilayer 100""' may allow the magnetic junction in which it is used to have improved performance.

Figure 8:
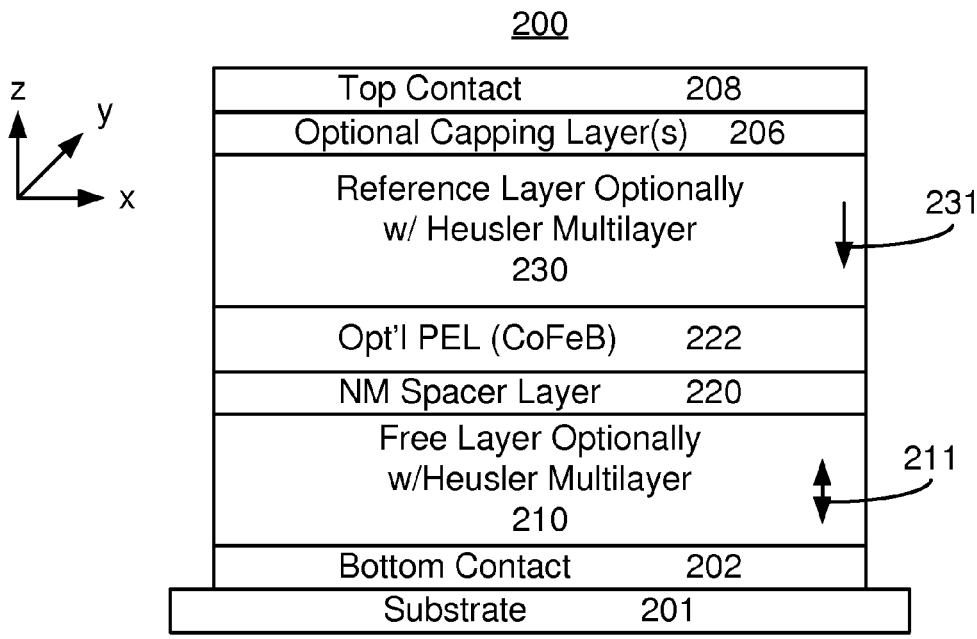
FIG. 8 depicts an exemplary embodiment of a magnetic junction including at least one Heusler multilayer, usable in a magnetic memory programmable using spin transfer torque.

FIG. 8 depicts an exemplary embodiment of a magnetic junction 200 using at least one Heusler multilayer and which is usable in a magnetic memory programmable utilizing spin transfer. For clarity, FIG. 8 is not to scale. The magnetic junction 200 may be used in a magnetic device such as a STT-RAM and, therefore, in a variety of electronic devices. The magnetic junction 200 includes a free layer 210 having magnetic moment 211, a nonmagnetic spacer layer 220, and a reference layer 230 having magnetic moment 231. Also shown is an underlying substrate 201 in which devices including but not limited to a transistor may be formed. Bottom contact 202, top contact 208, optional seed layer(s) 204 and optional capping layer(s) 206 are also shown.

As can be seen in FIG. 8, the reference layer 230 is closer to the top (furthest from a substrate 201) of the magnetic junction 200. However, in other embodiments, the reference layer 230 may be closer to the substrate 201 than the free layer 210. An optional pinning layer (not shown) may be used to fix the magnetization (not shown) of the reference layer 230. In some embodiments, the optional pinning layer may be an AFM layer or multilayer that pins the magnetization (not shown) of the reference layer 230 by an exchange-bias interaction. However, in other embodiments, the optional pinning layer may be omitted or another structure may be used.

The magnetic junction 200 is also configured to allow the free layer 210 to be switched between stable magnetic states when a write current is passed through the magnetic junction 200. Thus, the free layer 210 is switchable utilizing spin transfer torque. In some embodiments, the switching is accomplished using only STT. However, in other embodiments, other mechanisms including but not limited to spin orbit torque and/or an applied field may also contribute to the switching.

The nonmagnetic spacer layer 220 may be an MgO tunneling barrier layer. The MgO layer may have a 200 orientation for enhanced tunneling magnetoresistance (TMR). However, in other embodiments, the nonmagnetic spacer layer 220 may be a conductor, such as Cu, or another insulating tunneling barrier layer. Other configurations, such as conductive channels in an insulating matrix, are also possible.

The reference layer 230 and the free layer 210 are magnetic. In the embodiment shown, the perpendicular magnetic anisotropy of the free layer 210 exceeds its out-of-plane demagnetization energy. Similarly, the perpendicular magnetic anisotropy of the reference layer 230 exceeds its out-of-plane demagnetization energy. Thus, the easy axis 211 of the free layer 210 and the magnetic moment 231 of the reference layer 230 are shown as perpendicular-to-plane (in the z-direction). In other embodiments, one or both of the layers 210 and 230 might be in-plane.

The reference layer 230 and/or the free layer 210 may be a multilayer. For example, the reference layer 230 may be a SAF including multiple ferromagnetic layers interleaved with nonmagnetic layer(s). In such embodiments, the magnetic moments of the ferromagnetic layers maybe coupled antiparallel. Each ferromagnetic layer may also include sublayers including but not limited to multiple ferromagnetic layers. In other embodiments, the reference layer 230 may be another multilayer. Further, a polarization enhancement layer (PEL) 222 having a high spin polarization and/or other layer(s) is provided between the reference layer 230 and the nonmagnetic spacer layer 220. In some embodiments, a PEL (not shown) may be between the free layer 210 and the nonmagnetic spacer layer 220. For example, the PEL 222 may include a CoFeB layer. However, in the embodiment shown, the free layer 210 and the reference layer 230 each share an interface with the nonmagnetic spacer layer 220.

The free layer 210 and/or the reference layer 230 includes one or more Heusler multilayers such as the multilayer(s) 100, 100', 100'', 100''', 100'''' and/or 100'''''. Thus, in one embodiment, only the free layer 210 includes the Heusler multilayer(s) 100, 100', 100'', 100''', 100'''' and/or 100'''''. In another embodiment, only the reference layer 230 includes the Heusler multilayer(s) 100, 100', 100'', 100''', 100'''' and/or 100'''''. In still another embodiment, both the free layer 210 and the reference layer 230 includes the Heusler multilayer(s) 100, 100', 100'', 100''', 100'''' and/or 100'''''. The free layer 210 and/or the reference layer 230 may consist only of the Heusler multilayer(s) 100, 100', 100'', 100''', 100'''' and/or 100'''''. If the reference layer 230 (or free layer 210) consists of one or more Heusler multilayers, then the reference layer 230 (or free layer 210) is free of hexagonal close packed magnetic materials and free of face-centered cubic magnetic materials having a (111) orientation. In other embodiments, the free layer 210 and/or the reference layer 230 may include other sublayers.

The magnetic junction 200 may enjoy the benefits of Heusler multilayer(s) 100, 100', 100'', 100''', 100'''' and/or 100'''''. If used in the free layer 210, the Heusler multilayer(s) may provide the desired PMA, the desired temperature dependence of PMA, improved switching and/or sufficient magnetoresistance. Similarly, the Heusler multilayer(s) in the reference layer 230 may ensure that the reference layer 230 has the desired PMA, temperature dependence of PMA and that the magnetic junction 200 has sufficient magnetoresistance. Thus, the free layer 210 and/or reference layer 230 may have the desired magnetic properties. The magnetic junction 200 may also have the improved magnetoresistance, reduced damping and desired configuration of PMA due to the Heusler multilayer(s) 100, 100', 100'', 100''', 100'''' and/or 100'''''. Thus, a magnetic junction having the desired magnetic orientation, signal and moderate switching current for STT switching may be achieved.

Figure 9:
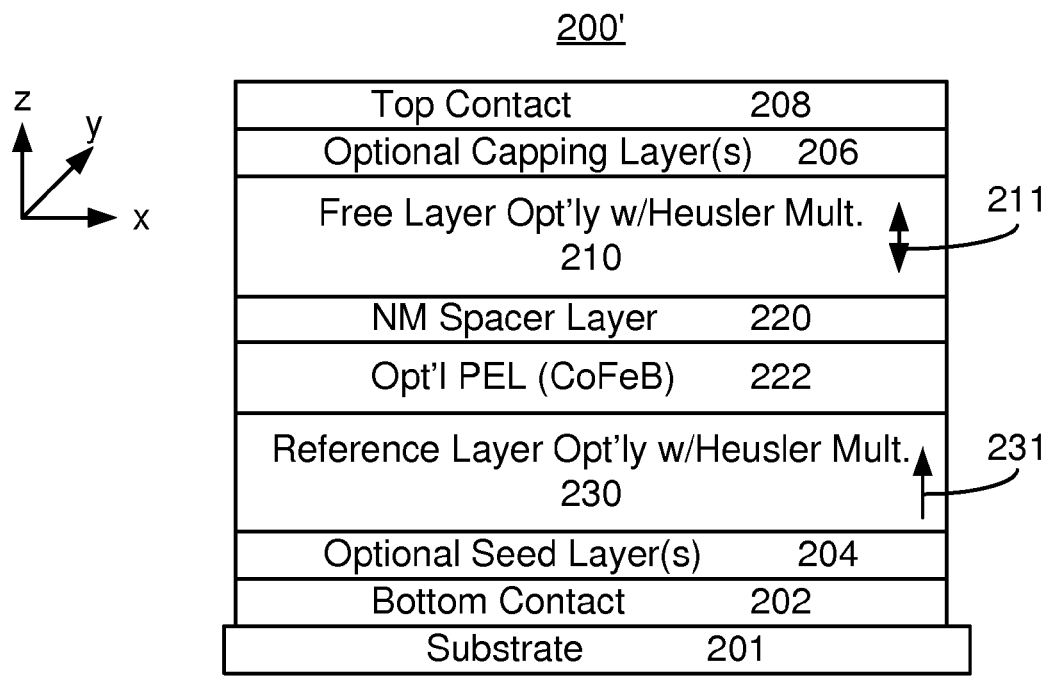
FIG. 9 depicts another exemplary embodiment of a magnetic junction including at least one Heusler multilayer, usable in a magnetic memory programmable using spin transfer torque.

FIG. 9 depicts an exemplary embodiment of a magnetic junction 200' using at least one Heusler multilayer and which is usable in a magnetic memory programmable utilizing spin transfer. For clarity, FIG. 9 is not to scale. The magnetic junction 200' may be used in a magnetic device such as a STT-RAM and, therefore, in a variety of electronic devices. The magnetic junction 200' is analogous to the magnetic junction 200. As a result, similar components have similar labels. The magnetic junction 200' includes a free layer 210 having magnetic moment 211, a nonmagnetic spacer layer 220, and a reference layer 230 having magnetic moment 231 that are analogous to the free layer 210 having magnetic moment 211, the nonmagnetic spacer layer 220, and the reference layer 230 having magnetic moment 231, respectively, depicted in FIG. 8. Also shown are an underlying substrate 201, bottom contact 202, top contact 208, optional seed layer(s) 204, optional capping layer(s) 206 and optional PEL 222 that are analogous to the substrate 201, bottom contact 202, top contact 208, optional seed layer(s) 204, optional capping layer 206 and optional PEL 222 shown in FIG. 8.

The magnetic junction 200' is also configured to allow the free layer 210 to be switched between stable magnetic states when a write current is passed through the magnetic junction 200'. Thus, the free layer 210 is switchable utilizing spin transfer torque. In some embodiments, the switching is accomplished using only STT. However, in other embodiments, other mechanisms including but not limited to spin orbit torque and/or an applied field may also contribute to the switching.

As can be seen in FIG. 9, the reference layer 230 is now closer to the substrate 201 than the free layer 210. The nonmagnetic spacer layer 220 is thus provided on the reference layer 210. The reference layer 230 and the free layer 210 are magnetic and analogous to those in the magnetic junction 200. In the embodiment shown, the perpendicular magnetic anisotropy of the reference layer 230 exceeds its out-of-plane demagnetization energy. Similarly, the perpendicular magnetic anisotropy of the free layer 210 exceeds its out-of-plane demagnetization energy. Thus, the easy axis 211 of the free layer 210 and the magnetic moment 231 of the reference layer 230 are shown as perpendicular-to-plane (in the z-direction). In other embodiments, one or both of the layers 210 and 230 might be in-plane. The free layer 210 and/or the reference layer 230 includes a Heusler multilayer such as the multilayer(s) 100, 100', 100'', 100''', 100'''' and/or 100'''''. If the reference layer 230 (or free layer 210) consists of one or more Heusler multilayers, then the reference layer 230 (or free layer 210) is free of hexagonal close packed magnetic materials and free of face-centered cubic magnetic materials having a (111) orientation.

The magnetic junction 200' may enjoy the benefits of the Heusler multilayer(s) 100, 100', 100'', 100''', 100'''' and/or 100''''' as well as the magnetic junction 200. Thus, a magnetic junction having the desired magnetic orientation, PMA configuration, magnetoresistance and moderate switching current for STT switching may be achieved.

Figure 10:
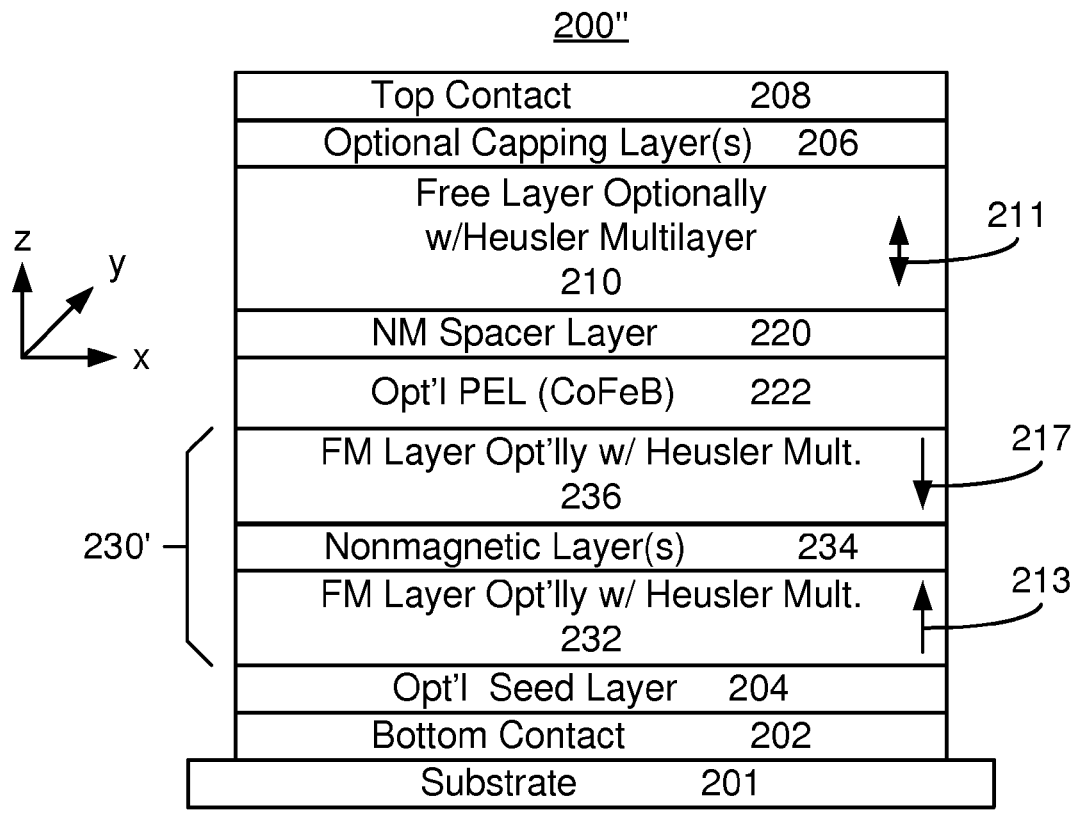
FIG. 10 depicts another exemplary embodiment of a magnetic junction including at least one Heusler multilayer, usable in a magnetic memory programmable using spin transfer torque.

FIG. 10 depicts an exemplary embodiment of a magnetic junction 200'' using at least one Heusler multilayer and which is usable in a magnetic memory programmable utilizing spin transfer. For clarity, FIG. 10 is not to scale. The magnetic junction 200'' may be used in a magnetic device such as a STT-RAM and, therefore, in a variety of electronic devices. The magnetic junction 200'' is analogous to the magnetic junction 200 and/or 200'. As a result, similar components have similar labels. The magnetic junction 200'' includes a free layer 210 having magnetic moment 211, a nonmagnetic spacer layer 220, and a reference layer 230' that are analogous to the free layer 210 having magnetic moment 211, the nonmagnetic spacer layer 220, and the reference layer 230 having magnetic moment 231, respectively, depicted in FIGS. 8-9. Also shown are an underlying substrate 201, bottom contact 202, top contact 208, optional seed layer(s) 204, optional capping layer(s) 206 and optional PEL 222 that are analogous to the substrate 201, bottom contact 202, top contact 208, optional seed layer(s) 204, optional capping layer 206 and PEL shown in FIGS. 8-9.

The magnetic junction 200'' is also configured to allow the free layer 210 to be switched between stable magnetic states when a write current is passed through the magnetic junction 200''. Thus, the free layer 210 is switchable utilizing spin transfer torque. In some embodiments, the switching is accomplished using only STT. However, in other embodiments, other mechanisms including but not limited to spin orbit torque and/or an applied field may also contribute to the switching.

As can be seen in FIG. 10, the reference layer 230' is closer to the substrate 201 than the free layer 210. The nonmagnetic spacer layer 220 is thus provided on the reference layer 210' in the embodiment shown. In another embodiment, the free layer 210 might be closer to the substrate than the reference layer 230'. In such an embodiment, the nonmagnetic spacer layer 220 may be grown on the free layer 210. The reference layer 230' and the free layer 210 are magnetic and analogous to those in the magnetic junction(s) 200 and/or 200'. In the embodiment shown, the perpendicular magnetic anisotropy of the reference layer 230' exceeds its out-of-plane demagnetization energy. Similarly, the 'perpendicular magnetic anisotropy of the free layer 210 exceeds its out-of-plane demagnetization energy. Thus, the easy axis 211 of the free layer 210 and the magnetic moment of the reference layer 230' are shown as perpendicular-to-plane. In other embodiments, one or both of the layers 210 and 230' might be in-plane. The free layer 210 and/or the reference layer 230' includes at least one Heusler multilayer such as the multilayer(s) 100, 100', 100'', 100''', 100'''' and/or 100'''''.

The reference layer 230' is also a SAF. Thus, the reference layer 230' includes ferromagnetic layers 232 and 236 interleaved with and separated by nonmagnetic layer 234. In such an embodiment, the ferromagnetic layer 232 may be pinned by a pinning layer (not shown) and is thus denoted as a reference layer. The ferromagnetic layer 232 and/or the ferromagnetic layer 236 may include one or more Heusler multilayer(s) 100, 100', 100'', 100''', 100'''' and/or 100'''''. The ferromagnetic layer 232 and/or the ferromagnetic layer 236 may consist only of the Heusler multilayer(s) 100, 100', 100'', 100''', 100'''' and/or 100'''''. If the reference layer ferromagnetic layers 232 and/or 236 (or free layer 210) consists of one or more Heusler multilayers, then the ferromagnetic layers 232 and/or 236 (or free layer 210) is free of magnetic materials that are hexagonal close packed magnetic and free of magnetic materials that are face-centered cubic having a (111) orientation. In other embodiments, the ferromagnetic layer 232 and/or the ferromagnetic layer may include other sublayer(s).

The magnetic junction 200'' may enjoy the benefits of the Heusler multilayer(s) 100, 100', 100'', 100''', 100'''' and/or 100''''' as well as the magnetic junction 200 and/or 200'. Thus, the magnetic junction 200'' may have the desired magnetic orientation, PMA configuration, magnetoresistance signal and moderate switching current for STT switching may be achieved.

Figure 11:
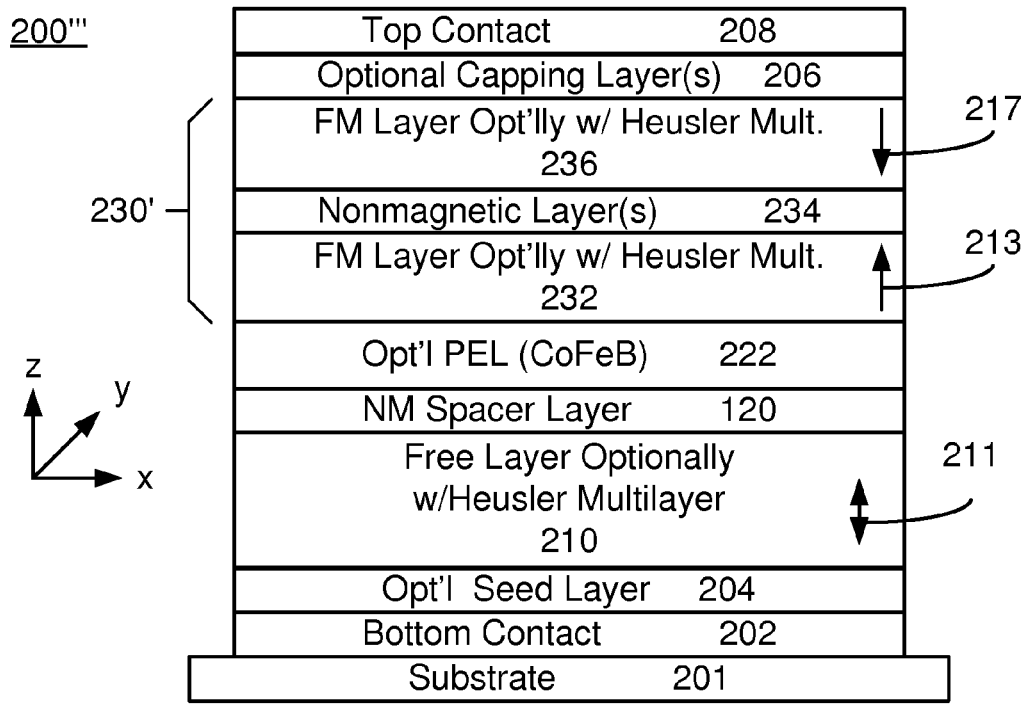
FIG. 11 depicts another exemplary embodiment of a magnetic junction including at least one Heusler multilayer, usable in a magnetic memory programmable using spin transfer torque.

FIG. 11 depicts an exemplary embodiment of a magnetic junction 200''' using at least one Heusler multilayer and which is usable in a magnetic memory programmable utilizing spin transfer. For clarity, FIG. 11 is not to scale. The magnetic junction 200''' may be used in a magnetic device such as a STT-RAM and, therefore, in a variety of electronic devices. The magnetic junction 200''' is analogous to the magnetic junction 200, 200' and/or 200''. As a result, similar components have similar labels. The magnetic junction 200''' includes a free layer 210 having magnetic moment 211, a nonmagnetic spacer layer 220, and a reference layer 230' that are analogous to the free layer 210 having magnetic moment 211, the nonmagnetic spacer layer 220, and the reference layer 230 having magnetic moment 231, respectively, depicted in FIGS. 8-10. Also shown are an underlying substrate 201, bottom contact 202, top contact 208, optional seed layer(s) 204, optional capping layer(s) 206 and optional PEL 222 that are analogous to the substrate 201, bottom contact 202, top contact 208, optional seed layer(s) 204, optional capping layer 206 and PEL 222 shown in FIGS. 8-10. In this embodiment, however, the free layer 210 is closer to the substrate 201 than the reference layer 230'.

The magnetic junction 200''' may enjoy the benefits of the Heusler multilayer(s) 100, 100', 100'', 100''', 100'''' and/or 100''''' as well as the magnetic junction 200, 200' and/or 200''. Thus, the magnetic junction 200''' may have the desired magnetic orientation, PMA configuration, magnetoresistance signal and moderate switching current for STT switching may be achieved.

Figure 12:
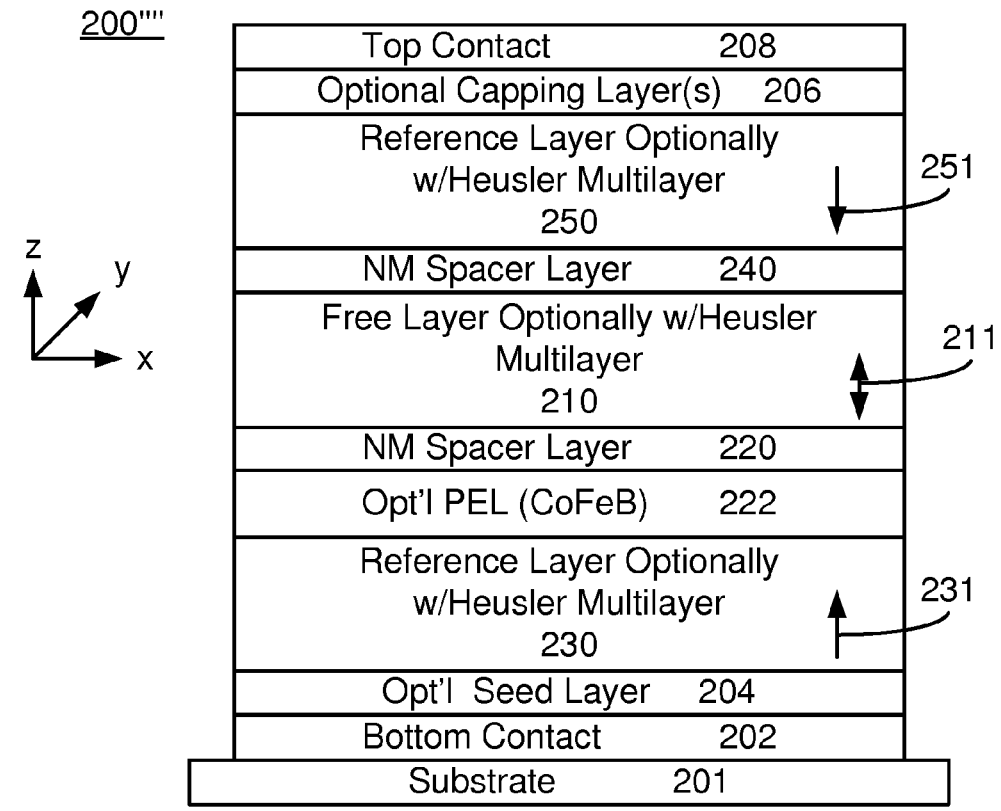
FIG. 12 depicts another exemplary embodiment of a magnetic junction including at least one Heusler multilayer, usable in a magnetic memory programmable using spin transfer torque.

FIG. 12 depicts an exemplary embodiment of a magnetic junction 200'''' using at least one Heusler multilayer and which is usable in a magnetic memory programmable utilizing spin transfer. For clarity, FIG. 12 is not to scale. The magnetic junction 200'''' may be used in a magnetic device such as a STT-RAM and, therefore, in a variety of electronic devices. The magnetic junction 200'''' is analogous to the magnetic junction 200, 200', 200'' and/or 200'''. As a result, similar components have similar labels. The magnetic junction 200'''' includes a free layer 210 having magnetic moment 211, a nonmagnetic spacer layer 220, and a reference layer 230 that are analogous to the free layer 210 having magnetic moment 211, the nonmagnetic spacer layer 220, and the reference layer 230/230' having magnetic moment 231, respectively, depicted in FIGS. 8-11. Also shown are an underlying substrate 201, bottom contact 202, top contact 208, optional seed layer(s) 204, optional capping layer(s) 206 and optional PEL 222 that are analogous to the substrate 201, bottom contact 202, top contact 208, optional seed layer(s) 204, optional capping layer 206 and optional PEL 222 shown in FIGS. 8-10.

The magnetic junction 200'''' is also configured to allow the free layer 210 to be switched between stable magnetic states when a write current is passed through the magnetic junction 200''''. Thus, the free layer 210 is switchable utilizing spin transfer torque. In some embodiments, the switching is accomplished using only STT. However, in other embodiments, other mechanisms including but not limited to spin orbit torque and/or an applied field may also contribute to the switching.

As can be seen in FIG. 12, magnetic junction 200'''' is a dual magnetic junction. Thus, the magnetic junction 200'''' also includes an additional nonmagnetic spacer layer 240 and an additional reference layer 250 that are analogous to the layers 220 and 230/230', respectively. In the embodiment shown, the magnetic moments 231 and 251 of the reference layers 230 and 250 are aligned antiparallel (in a dual state). However, in other embodiments or another configuration, the magnetic moments 231 and 251 may be in the anti-dual state (parallel). The nonmagnetic spacer layer 240 may be a conductor, an insulating tunneling barrier layer such as crystalline MgO or may have another structure. The reference layer 250 may optionally include one or more repeats of the Heusler multilayer(s) 100, 100', 100'', 100''', 100'''' and/or 100'''''. The perpendicular magnetic anisotropy of the reference layers 230 and 250 exceed their out-of-plane demagnetization energy. Thus, the magnetic moments of the reference layers 230 and 250 are perpendicular-to-plane. In other embodiments, the magnetic moment of the reference layer 230 and/or 250 might be in-plane. The reference layer 250 may also be a SAF. Although not shown, an optional PEL might be included between the spacer layer 240 and the reference layer 250.

The magnetic junction 200'''' may enjoy the benefits of the Heusler multilayer(s) 100, 100', 100'', 100''', 100'''' and/or 100''''' as well as the magnetic junction(s) 200, 200', 200'' and/or 200'''. It is also noted that the Heusler multilayer 100''''' may be of particularly utility in the free layer 210 because such a free layer may have a PMA configured to increase with increasing distance from the spacer layers 220 and 240. Thus, the magnetic junction 200'''' may have the desired magnetic orientation, PMA configuration, magnetoresistance signal and moderate switching current for STT switching may be achieved.

Figure 13:
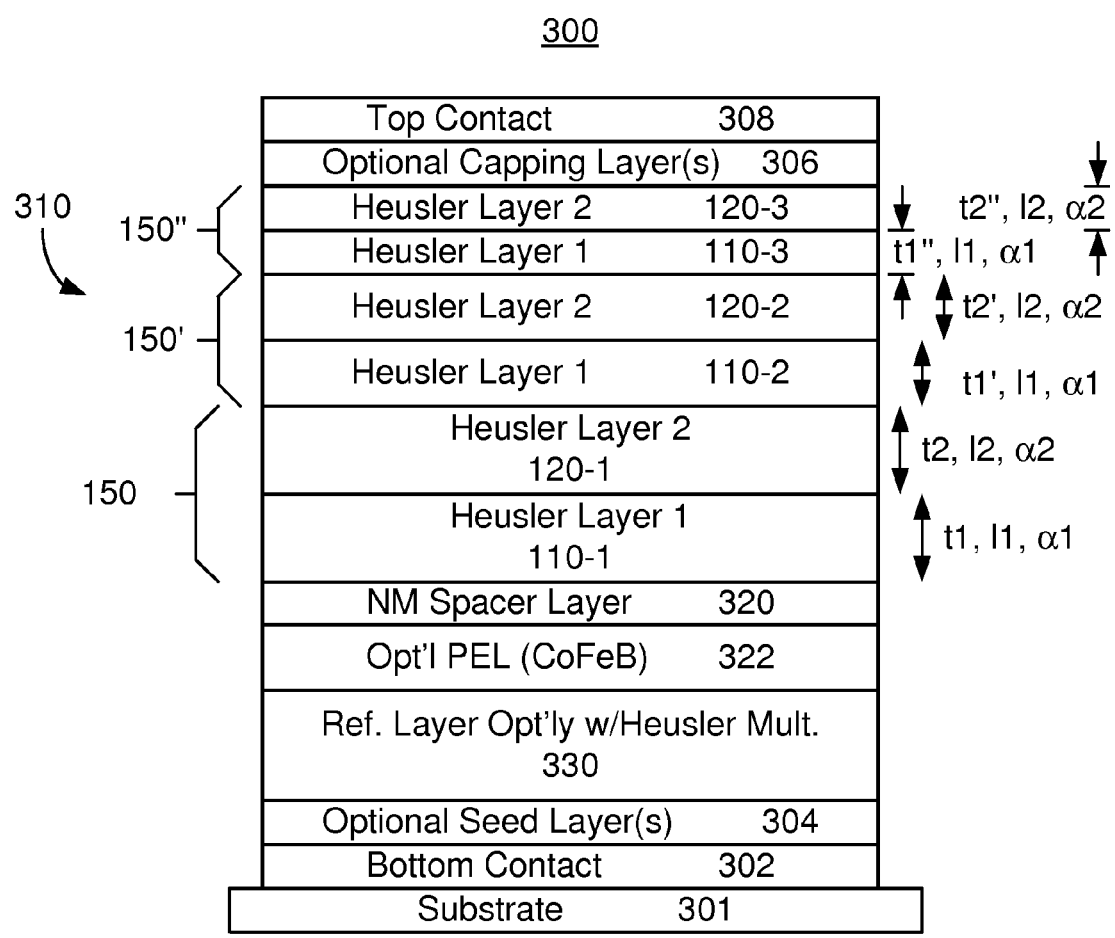
FIG. 13 depicts another exemplary embodiment of a magnetic junction including at least one Heusler multilayer, usable in a magnetic memory programmable using spin transfer torque.

Various configurations of Heusler multilayer(s) 100, 100', 100", 100''', 100"" and/or 100''''' as well as the magnetic junction(s) 200, 200', 200", 200''' and/or 200"" are highlighted. One of ordinary skill in the art will recognize that various features of the multilayer(s) 100, 100', 100", 100''', 100"" and/or 100''''' and particular features of the magnetic junction(s) 200, 200', 200", 200''' and/or 200"" may be combined. For example, FIG. 13 depicts an exemplary embodiment of a magnetic junction 300 using at least one Heusler multilayer and which is usable in a magnetic memory programmable utilizing spin transfer. For clarity, FIG. 13 is not to scale. The magnetic junction 300 may be used in a magnetic device such as a STT-RAM and, therefore, in a variety of electronic devices. The magnetic junction 300 is analogous to the magnetic junction 200, 200', 200", 200''' and/or 200"". As a result, similar components have similar labels. The magnetic junction 300 includes a free layer 310, a nonmagnetic spacer layer 320, and a reference layer 330 that are analogous to the free layer 210, the nonmagnetic spacer layer 220, and the reference layer 230/230', respectively, depicted in FIGS. 8-12. Also shown are an underlying substrate 301, bottom contact 302, top contact 308, optional seed layer(s) 304, optional capping layer(s) 306 and optional PEL 322 that are analogous to the substrate 201, bottom contact 202, top contact 208, optional seed layer(s) 204, optional capping layer 206 and optional PEL 222 shown in FIGS. 8-12. In the embodiment shown in FIG. 13, the free layer 310 explicitly consists of the Heusler multilayer 100''''. Thus, the free layer 310 has a gradient in PMA such that the PMA decreases with increasing distance from the nonmagnetic spacer layer. Thus, one or more of the benefits described herein may be achieved.

Figure 14:
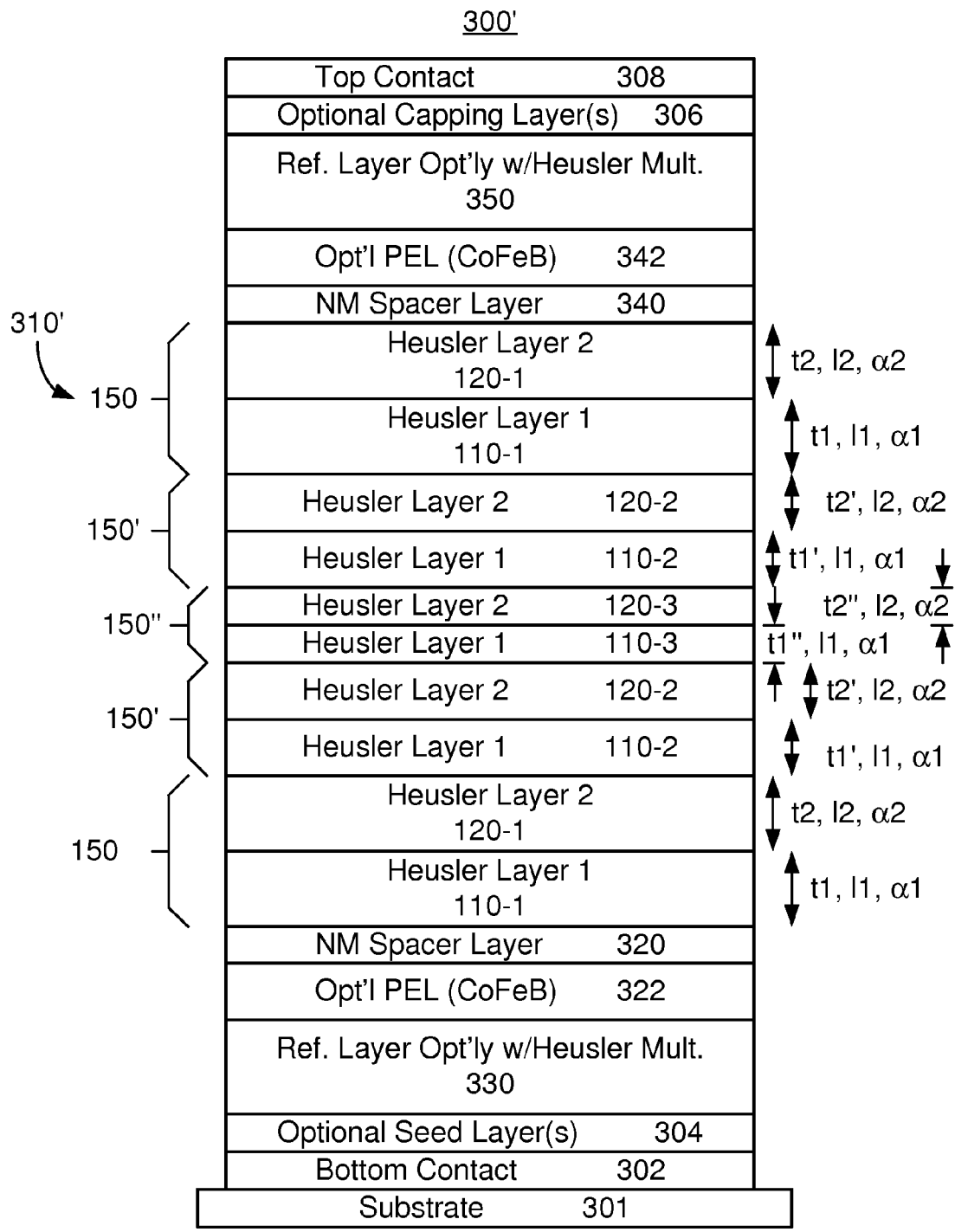
FIG. 14 depicts another exemplary embodiment of a magnetic junction including at least one Heusler multilayer, usable in a magnetic memory programmable using spin transfer torque.

Similarly, FIG. 14 depicts an exemplary embodiment of a magnetic junction 300' using at least one Heusler multilayer and which is usable in a magnetic memory programmable utilizing spin transfer. For clarity, FIG. 14 is not to scale. The magnetic junction 300' may be used in a magnetic device such as a STT-RAM and, therefore, in a variety of electronic devices. The magnetic junction 300' is analogous to the magnetic junction 200, 200', 200", 200''' and/or 200"" as well as the magnetic junction 300. As a result, similar components have similar labels. The magnetic junction 300' includes a free layer 310', a nonmagnetic spacer layer 320, and a reference layer 330 that are analogous to the free layer 210/310, the nonmagnetic spacer layer 220/320, and the reference layer 230/230'/330, respectively, depicted in FIGS. 8-13. Also shown are an underlying substrate 301, bottom contact 302, top contact 308, optional seed layer(s) 304, optional capping layer(s) 306 and optional PEL 322 that are analogous to the substrate 201, bottom contact 202, top contact 208, optional seed layer(s) 204, optional capping layer 206 and optional PEL 222 shown in FIGS. 8-12. In the embodiment shown in FIG. 14, the magnetic junction 300' is a dual magnetic junction. Thus, a nonmagnetic spacer layer 340, an optional PEL 342 and an additional reference layer 350 analogous to the layers 240, 222/322 and 250 are shown. In addition, the free layer 310' explicitly consists of the Heusler multilayer 100''''. Thus, the free layer 310' has a gradient in PMA such that the PMA decreases with increasing distance from the nonmagnetic spacer layers 320 and 340. Thus, one or more of the benefits described herein may be achieved.

Figure 15:
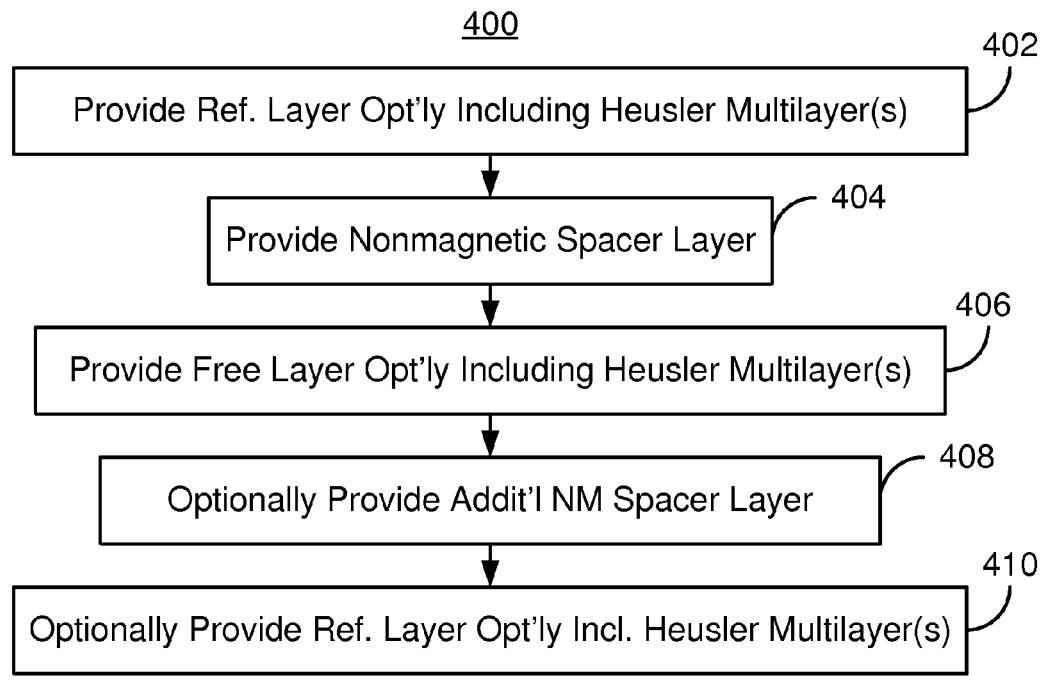
FIG. 15 is a flow chart depicting an exemplary embodiment of a method for providing a magnetic junction including at least one Heusler multilayer usable in a magnetic memory programmable using spin transfer torque.

FIG. 15 depicts an exemplary embodiment of a method 400 for fabricating a magnetic junction including Heusler multilayer(s) and usable in a magnetic device such as a spin transfer torque random access memory (STT-RAM) and, therefore, in a variety of electronic devices. For simplicity, some steps may be omitted, performed in another or combined. Further, the method 400 may start after other steps in forming a magnetic memory have been performed. For simplicity, the method 400 is described in the context of the magnetic junctions 200, 200', 200", 200''', 200"", 300 and 300'. However, other magnetic junctions may be formed.

A reference layer 230/230'/330 that may include Heusler multilayer(s) 100, 100', 100", 100''', 100"" and/or 100''''' is provided on the substrate, via step 402. In some embodiments, step 402 includes depositing the material(s) for the reference layer 230/330. Step 402 may also include annealing the reference layer 430, or otherwise providing adequate energy for crystallization, in order to provide the desired crystallographic structure of the layer(s) in the Heusler multilayer(s) 100, 100', 100", 100''', 100"" and/or 100''''. The edges of the reference layer 230/330 may be defined at a later time, for example after deposition of the remaining layers of the magnetic junction.

A nonmagnetic spacer layer 220/320 is provided, via step 404. Step 404 may include depositing MgO, which forms a tunneling barrier layer. In some embodiments, step 404 may include depositing MgO using, for example, radio frequency (RF) sputtering. In other embodiments, metallic Mg may be deposited, then oxidized in step 404. As discussed above with respect to step 402, the edges of the nonmagnetic spacer layer 220/320 may be defined at a later time, for example after deposition of the remaining layers of the magnetic junction. In addition, the anneal step discussed above may be performed after deposition of the nonmagnetic spacer layer 220/320 in step 404.

A free layer 210/310/310' is provided, via step 406. In some embodiments, step 406 includes providing Heusler multilayer(s) 100, 100', 100", 100''', 100"" and/or 100'''''for the free layer 210/310/310'. Thus, the nonmagnetic spacer layer 220 is between the reference layer 230/230'/330 and the free layer 210/310/310'. As discussed above with respect to step 402, the edges of the reference layer may be defined at a later time, for example after deposition of the remaining layers of the magnetic junction.

If a dual magnetic junction 200""/300' is to be provided, the additional nonmagnetic spacer layer 240/3440 is provided, via step 408. Step 408 is analogous to step 404. In addition, annealing, or otherwise providing adequate energy for crystallization, may be performed for the spacer layer 240/340. This annealing and/or energy addition may also be used on the Heusler multilayer(s) of the free layer 210/310/310' provided in step 406.

If the dual magnetic junction 200""/300' is being fabricated, then the reference layer 250/350 is provided, via step 410. Step 410 may include providing Heusler multilayer(s) 100, 100', 100", 100''', 100"" and/or 100'''''. Fabrication of the magnetic junction may be completed. For example, capping layers may be deposited and the edges of the magnetic junction defined.

Using the method 400, the magnetic junction 200, 200', 200", 200''', 200"", 300 and/or 300' may be formed. Thus, the benefits of the magnetic junction(s) 200, 200', 200", 200''', 200"", 300 and/or 300' may be achieved.

Figure 16:
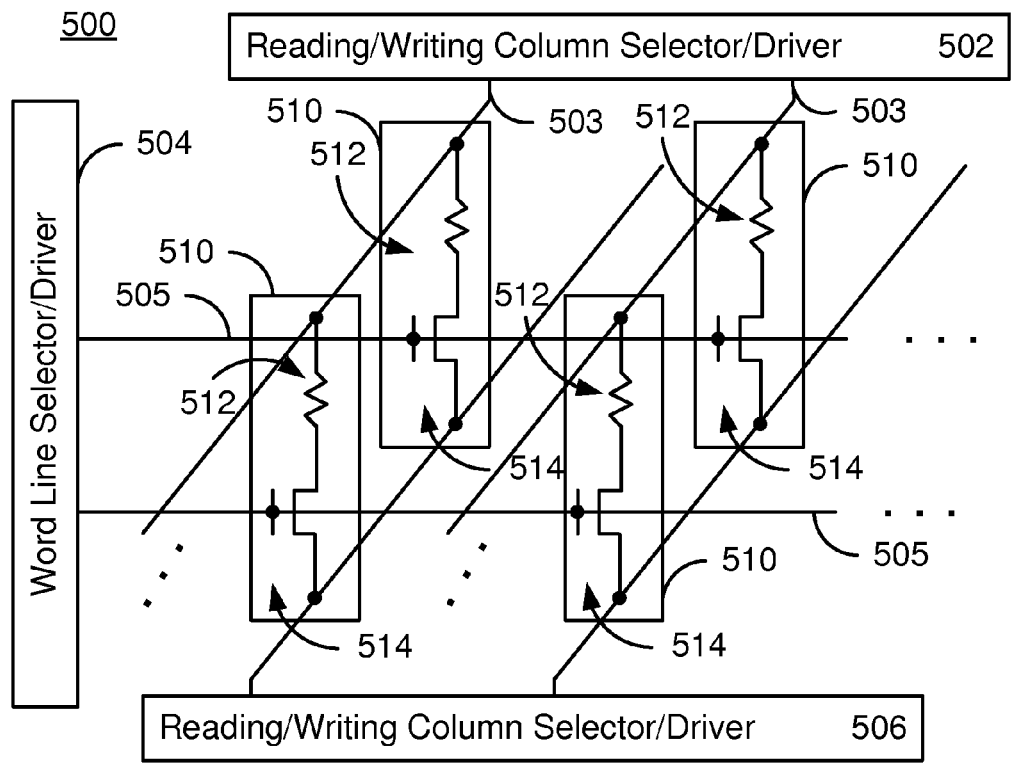
FIG. 16 depicts an exemplary embodiment of a memory utilizing magnetic junctions in the memory element(s) of the storage cell(s).

FIG. 16 depicts an exemplary embodiment of a memory 500 that may use one or more of the magnetic junctions 200, 200', 200", 200''', 200"", 300 and/or 300' as well as the Heusler multilayer(s) 100, 100', 100", 100''', 100"" and/or 100''''. The magnetic memory 500 includes reading/writing column select drivers 502 and 506 as well as word line select driver 504. Note that other and/or different components may be provided. The storage region of the memory 500 includes magnetic storage cells 510. Each magnetic storage cell includes at least one magnetic junction 512 and at least one selection device 514. In some embodiments, the selection device 514 is a transistor. The magnetic junctions 512 may be one of the magnetic junctions 200, 200', 200'', 200''', 200'''', 300 and/or 300' disclosed herein. Although one magnetic junction 512 is shown per cell 510, in other embodiments, another number of magnetic junctions 512 may be provided per cell. As such, the magnetic memory 500 may enjoy the benefits described above.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction residing on a substrate and usable in a magnetic device comprising:
    a free layer;
    a nonmagnetic spacer layer; and
    a reference layer, the nonmagnetic spacer layer residing between reference layer and the free layer, at least one of the free layer and the reference layer including at least one Heusler multilayer, each of the at least one Heusler multilayer including a plurality of Heusler layers sharing at least one interface, the plurality of Heusler layers including a plurality of Heusler alloys, having a plurality of lattice parameters and having a plurality of coefficients of thermal expansion;
    wherein the magnetic junction is configured such that the free layer is switchable between a plurality of stable magnetic states when a write current is passed through the magnetic junction.

2. The magnetic junction of claim 1 wherein the free layer includes a Heusler multilayer of the at least one Heusler multilayer.

3. The magnetic junction of claim 1 wherein the reference layer includes a Heusler multilayer of the at least one Heusler multilayer.

4. The magnetic junction of claim 1 wherein the at least one of the free layer and the reference layer that includes the at least one Heuser multilayer is free of hexagonal close packed magnetic materials and free of face-centered cubic magnetic materials having a (111) orientation.

5. The magnetic junction of claim 3 wherein the reference layer is a synthetic antiferromagnetic including a first magnetic layer, a second magnetic layer and a nonmagnetic body centered cubic (BCC) layer between the first magnetic layer and the second magnetic layer, the first magnetic layer including the first Heusler multilayer, the second magnetic layer including a second Heusler multilayer of the at least one Heusler multilayer.

6. The magnetic junction of claim 3 further comprising:
    a polarization enhancement layer between the reference layer and the nonmagnetic spacer layer.

7. The magnetic junction of claim 1 wherein the at least one of the free layer and the reference layer consists of the at least one Heusler multilayer.

8. The magnetic junction of claim 1 wherein the plurality of lattice parameters and the plurality of coefficients of thermal expansion differ.

9. The magnetic junction of claim 8 wherein the plurality of coefficients of thermal expansion are configured such that a difference between lattice parameters of adjoining Heusler layers decreases with increasing temperature.

10. The magnetic junction of claim 8 wherein the plurality of coefficients of thermal expansion are configured such that a difference between lattice parameters of adjoining Heusler layers increases with increasing temperature.

11. The magnetic junction of claim 1 wherein the free layer includes a Heusler multilayer of the at least one Heusler multilayer, the plurality of Heusler layers in the Heusler multilayer have a plurality of thicknesses such that a free layer perpendicular magnetic anisotropy increases with increasing distance from the nonmagnetic spacer layer.

12. The magnetic junction of claim 1 further comprising:
    an additional nonmagnetic spacer layer, the free layer being between the additional nonmagnetic spacer layer and the nonmagnetic spacer layer; and
    an additional reference layer, the additional nonmagnetic spacer layer being between the free layer and the additional reference layer.

13. The magnetic junction of claim 12 wherein the additional reference layer includes an additional Heusler multilayer, the additional Heusler multilayer including an additional plurality of Heusler layers sharing at least one additional interface, the additional plurality of Heusler layers including an additional plurality of Heusler alloys, having an additional plurality of lattice parameters and having an additional plurality of coefficients of thermal expansion.

14. A magnetic memory residing on a substrate, the magnetic memory comprising:
    a plurality of magnetic storage cells, each of the plurality of magnetic storage cells including at least one magnetic junction, the at least one magnetic junction including a free layer, a nonmagnetic spacer layer and a reference layer, the nonmagnetic spacer layer residing between reference layer and the free layer, at least one of the free layer and the reference layer including at least one Heusler multilayer, each of the at least one Heusler multilayer including a plurality of Heusler layers sharing at least one interface, the plurality of Heusler layers including a plurality of Heusler alloys, having a plurality of lattice parameters and having a plurality of coefficients of thermal expansion, the at least one magnetic junction being configured such that the free layer is switchable between a plurality of stable magnetic states when a write current is passed through the magnetic junction; and
    a plurality of bit lines coupled with the plurality of magnetic storage cells.

15. A method for providing a magnetic junction residing on a substrate and usable in a magnetic device, the method comprising:
    providing a free layer;
    providing a nonmagnetic spacer layer; and
    providing a reference layer, the nonmagnetic spacer layer residing between reference layer and the free layer, at least one of the free layer and the reference layer including at least one Heusler multilayer, each of the at least one Heusler multilayer including a plurality of Heusler layers sharing at least one interface, the plurality of Heusler layers including a plurality of Heusler alloys, having a plurality of lattice parameters and having a plurality of coefficients of thermal expansion, the magnetic junction being configured such that the free layer is switchable between a plurality of stable magnetic states when a write current is passed through the magnetic junction.

16. The method of claim 15 wherein the at least one of the free layer and the reference layer that includes the at least one Heusler multilayer is free of hexagonal close packed magnetic materials and free of face-centered cubic magnetic materials having a (111) orientation.

17. The method of claim 16 wherein the reference layer is a synthetic antiferromagnetic including a first magnetic layer, a second magnetic layer and a nonmagnetic body centered cubic (BCC) layer between the first magnetic layer and the second magnetic layer, the first magnetic layer including the first Heusler multilayer, the second magnetic layer including a second Heusler multilayer of the at least one Heusler multilayer.

18. The method of claim 15 wherein the free layer includes a Heusler multilayer of the at least one Heusler multilayer; and
wherein the plurality of coefficients of thermal expansion are configured such that a difference between lattice parameters of adjoining Heusler layers increases with increasing temperature.

19. The method of claim 15 wherein the free layer includes a Heusler multilayer of the at least one Heusler multilayer, the plurality of Heusler layers in the Heusler multilayer have a plurality of thicknesses such that a free layer perpendicular magnetic anisotropy increases with increasing distance from the nonmagnetic spacer layer.

20. The method of claim 15 further comprising:
providing an additional nonmagnetic spacer layer, the free layer being between the additional nonmagnetic spacer layer and the nonmagnetic spacer layer; and
providing an additional reference layer, the additional nonmagnetic spacer layer being between the free layer and the additional reference layer, the additional reference layer includes an additional Heusler multilayer, the additional Heusler multilayer including an additional plurality of Heusler layers sharing at least one additional interface, the additional plurality of Heusler layers including an additional plurality of Heusler alloys, having an additional plurality of lattice parameters and having an additional plurality of coefficients of thermal expansion.

* * * * *